United States Patent [19]

Dumke et al.

[11] 4,396,931

[45] Aug. 2, 1983

[54] TUNNEL EMITTER UPPER VALLEY TRANSISTOR

[75] Inventors: William P. Dumke, Chappaqua; Alan B. Fowler, Yorktown Heights, both of N.Y.

[73] Assignee: International Business Machines Corporation, Armonk, N.Y.

[21] Appl. No.: 272,874

[22] Filed: Jun. 12, 1981

[51] Int. Cl.$^3$ ............... H01L 29/72; H01L 27/26; H01L 29/88; H01L 29/205

[52] U.S. Cl. .............................. 357/34; 357/3; 357/4; 357/12; 357/16

[58] Field of Search ............... 357/3, 34, 1, 12, 16, 357/4, 60

[56] References Cited

U.S. PATENT DOCUMENTS 3,467,896  9/1969  Kroemer ...................... 317/234

OTHER PUBLICATIONS

Aspnes et al., "Ordering and Absolute Energies of the $L_6{}^c$ and $X_6{}^c$ Conduction B and Minima in GaAs", *Phys. Rev.*, vol. 37, No. 12, Sep. 1976, pp. 766–769.

Chang et al., "Tunnel Triode–a Tunneling Base Transistor", *Applied Phys. Lett.*, vol. 31, No. 10, Nov. 1977, pp. 687–689.

Dumke et al., "Heterojunction–Long Lifetime Hot Electron Transistor", *IBM Tech. Disclosure Bull.*, vol. 24, No. 7A, Dec. 1981, pp. 3229–3231.

Dresselhaus et al., "Cyclotron Resonances of Electrons and Holes in Silicon & Germanium Crystals", *Phys. Rev.*, vol. 98, No. 2, Apr. 1955, pp. 368–384.

Heiblum, "Tunneling Hot Electron Transfer Amplifiers (THETA): A Proposal for Novel Amplifiers Operating in the Subpicosecond Range", *Int. Electron Device Meeting*, Washington, 1980, pp. 629–631.

Pozela et al., "Electron Transport Properties in GaAs at High Electric Fields", *Solid State Electronics*, vol. 23, pp. 927–933, (1979).

*Primary Examiner*—Martin H. Edlow
*Assistant Examiner*—J. L. Badgett
*Attorney, Agent, or Firm*—Alvin J. Riddles

[57] ABSTRACT

The invention is a three-terminal transistor structure having five layers of materials that in combination provide conduction by high mobility carrier transport across the base in an energy valley above the conduction band. The conduction is by majority carrier tunneling injection from the emitter and transport at an upper valley level across the base. The resulting structure is capable of switching in times of $10^{-12}$ seconds.

9 Claims, 3 Drawing Figures

TUNNEL EMITTER UPPER VALLEY TRANSISTOR

DESCRIPTION

1. Technical Field

The technical field of the invention is that of semiconductor devices having three terminals which can be operated for amplification, switching or dynamic resistance purposes.

2. Background Art

Semiconductor devices of the three-terminal or transistor type have been progressing in providing shorter switching times and larger signal amplification bandwidths. The standard mode of operation in such devices involves carrier motion in the base region by diffusion. The diffusion transport mechanism however is dependent on the diffusion constants of the minority carriers and the ability to have a narrow base width because of high concentrations and mobilities of minority carriers in the base region. In bipolar type transistors made of silicon, the carrier transport properties are a limiting factor on performance and the maximum carrier concentration in the base region is limited by the effect on the current gain. Some other semiconductor materials, such as GaAs, from which bipolar transistors may be fabricated, have high electron mobilities, but rather low hole mobilities, lower than in Si. Several schemes have been suggested which would allow the use of different types of electrons for both minority and majority carriers.

One transistor structure, the metal base transistor, has appeared in the art and is designed to function through the use of hot electrons injected in an energy range well above the top of the distribution of equilibrium electrons. In this device, the injected carriers traverse the base in a ballistic mode which is much faster than a diffusion mode. The device is reported in Proc. IRE, Vol. 48, No. 359, 1960 and J. Applied Physics, Vol. 32, Page 646, 1961. Such devices, however, have the problem that it is difficult to realize true ballistic transport because of the relatively short mean free paths for scattering of electrons in metals. Such scattering, because of the many energy states below the energy of the hot electrons, results in a rapid loss of the energy of these electrons.

Another hot electron ballistic transport type of transistor involves a combination of device structural specifications and bias to permit injection by tunneling from the conduction band edge and ballistic transport across the base. This device is described in application Ser. No. 118,251 filed Feb. 4, 1980.

DISCLOSURE OF THE INVENTION

In semiconductor crystals, there are conditions where there are energy minima at an excited level above the conduction band. These conditions are known as upper valleys. This invention is a three-terminal semiconductor device wherein the conduction is by emitter quantum mechanical tunnel injection and followed by transport of the injected carriers in a high upper valley in the semiconductor material of the base without relaxation to the lower conduction band valley in the base.

Figure 1:
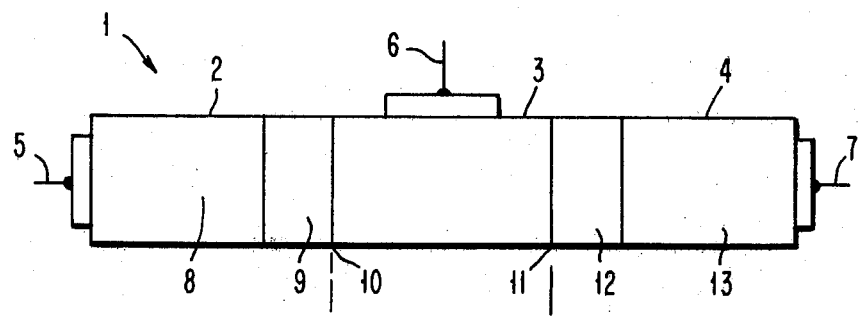
FIGS. 1 and 2 are a dimensionally correlated set of illustrations of the structure and of the energy levels of the device of the invention.

Referring to FIG. 1, a three-terminal semiconductor structure is illustrated wherein a monocrystalline semiconductor body 1 is provided with an emitter region 2, a base region 3, and a collector region 4, the emitter, base and collector regions each having ohmic contacts 5, 6 and 7 respectively.

The emitter region 2 is made up of two parts, 8 and 9, part 8 being the part to which the ohmic contact 5 is made and part 9 being the barrier portion which extends to a higher energy level than the external portion 8 and has a thickness dimension small enough for quantum mechanical tunneling shown as a sawtooth arrow 14 across the emitter base junction 10. The emitter and base have different conduction band minima. This is achieved in this structure by the portions 8 and 9 being made of different semiconductor materials. The injected carriers are of the type that have the higher mobility. In most materials this is usually electrons and the description will be set forth in terms of electrons although in the light of the principles set forth one skilled in the art will readily be able to select that appropriate higher mobility carrier. The emitter 2 and base 3 regions are selected such that there are normal electron states labelled (1,1,1) in the region 8 of the emitter 2 that have the same energy level as upper valley states in the base 3.

The base region 3 is of a different semiconductor material epitaxial with the material of the emitter region. The material of the base 3 has a different lower energy level than the materials of the emitter and has a thickness dimension sufficiently small for electron transport across the base to collector junction 11 to occur before the electrons scatter to this lower level. The base 3 has an excited upper valley state with electrons having energy labelled (1,1,1).

The collector region 4 is made up of two sections 12 and 13. Section 12 serves as the collector barrier. It is epitaxial with the base 3 material. The collector barrier 12 extends to a higher energy than the level of normal electrons in the base region 3, the level being close to the upper valley level in the emitter. Region 12 prevents the normal electrons in the lower minimum from flowing into the collector. Carriers that traverse the barrier at arrow 15 enter the section 13 and give up energy until reaching a lower level.

Figure 3:
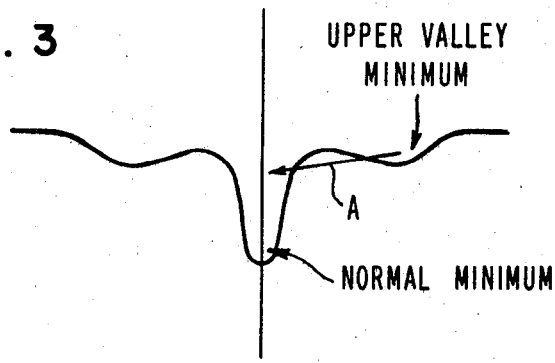
FIG. 3 is an energy level diagram illustrating the upper valley condition.

The barrier height and the barrier width in the emitter or carrier injecting region 9 is selected such that the dominant current injection mechanism is that of quantum mechanical tunneling. Referring to FIG. 3 there is shown a schematic energy level diagram illustrating the fact that carriers in certain materials exhibit a normal energy minimum and an upper valley minimum at a higher energy level.

The emitter 2 and base 3 semiconductor materials are selected such that normal electrons with for example (1,1,1) momentum from the emitter 2 are injected into an upper valley excited state of the base 3 of the same, for example (1,1,1) momentum.

The predominant current conduction mechanism through the base 3 is that of upper valley carrier transport without relaxation to the normal minimum. The material of the base 3 is selected so that there is an upper valley level labelled for example (1,1,1) and a lower energy minimum labelled for example (0,0,0). These conditions permit transit to occur across the base with a much reduced probability of energy loss as compared to the case where the carriers relax within the same minimum. This occurs because of a much lower rate of scattering outside the (1,1,1) valleys.

In accordance with the invention, a series of materials and conditions are structurally combined such that injected carriers enter an upper valley of the base so that the carriers will traverse the base to the collector with a much lower probability that they will lose energy in the process.

In selecting the semiconductor materials for the emitter and base, it is necessary that the base material have an upper conduction minimum or valley that is significantly above the lowest conduction band states of the material and that the emitter material have normal states of the same type as the excited states in the base region. Some material may have more than one minima. Electrons in the upper valley will remain in quasithermal equilibrium with the lattice of the crystal and will only lose a significant amount of energy if they scatter by a relatively less probable process to states that are in the lowest conduction minimum. This is shown in FIG. 3 by the arrow labelled A. In accordance with the invention, normal electrons in the emitter, for example (1,1,1) electrons, are injected into a (1,1,1) upper valley base material so that transport can take place with reduced probability of energy loss. The device of the invention operates with very high speed and provides switching in the range of $10^{-12}$ seconds.

In the structure of the invention the various layers will be epitaxial with the same lattice periodicity. Under these conditions, it should be expected that the transverse momentum of the electrons will be conserved in any tunneling process between the emitter 2 and the base 3. Tunneling processes that do not conserve momentum have a low probability of occurring.

It has been found that these conditions are sensitive to crystallographic directions. Crystallographic directions are indicated by Miller indices for intercepts with crystalline axes, as for example [1,0,0]. Where the crystallographic directions of the individual layers are properly arranged, the electrons will only tunnel efficiently into the higher upper valley states but not into the lower states since these states have a different transverse momentum.

BEST MODE FOR CARRYING OUT THE INVENTION

Figure 2:
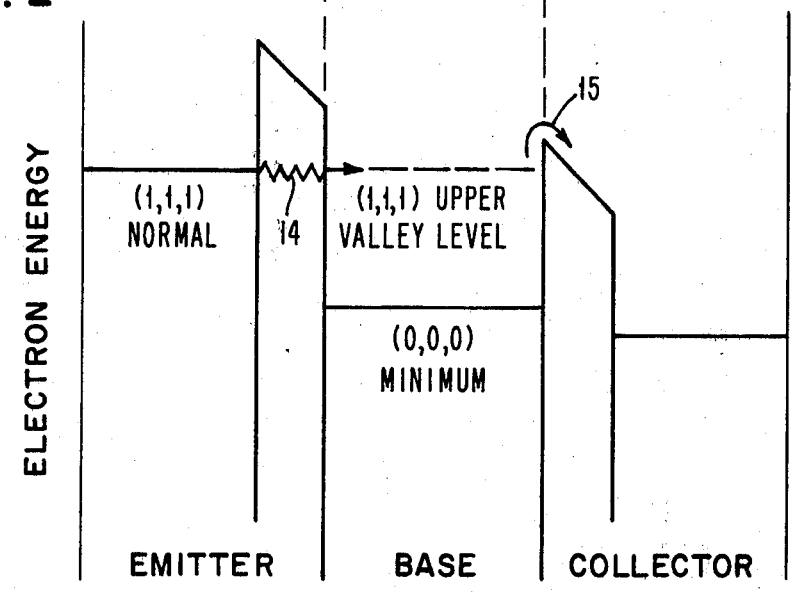

Referring to FIGS. 1 and 2 together, a five-layer structure is provided. The emitter region 2 is made of epitaxial layers of semiconductor material, the first region 8 of which has energies for normal electrons that correspond to upper valley energies in the base. These valleys have been labelled for example (1,1,1). A barrier region 9 is provided. The barrier 9 is of a higher energy level than the (1,1,1) level and is sufficiently thin for quantum mechanical tunneling 14 of the electrons.

The base region 3 is made of a semiconductor material that is epitaxial with the region 9 and has an upper valley level corresponding to the emitter example (1,1,1) minima with a (0,0,0) minimum that is lower. The region 3 has a width sufficiently narrow that an injected carrier will remain in the upper valleys in quasithermal equilibrium with the lattice until it reaches the collector region.

The collector barrier region 12 is again epitaxial with the base 3. The region 12 has a barrier that is lower than the emitter barrier and at most only slightly higher than the (1,1,1) level. The remaining region of the collector has a normal level lower than the base region.

To provide a starting place for one skilled in the art to practice the invention, the interrelated semiconductor conditions are set forth in three examples in Table 1.

TABLE 1

| Structure No. | Region | Material | Width | Doping | Crystallographic Orientation |
|---|---|---|---|---|---|
| 1 | Emitter | Ga.5Al.5As | >100Å | n-10¹⁸ | [100] |
|   | Emitter Barrier | AlAs | 25Å | n-10¹⁶ | [100] |
|   | Base | GaAs | 250Å | n-10¹⁸ | [100] |
|   | Collector Barrier | Ga.75Al.25As | 50Å | n-10¹⁶ | [100] |
|   | Collector | GaAs | >100Å | n-10¹⁸ | [100] |
| 2 | Emitter | Ge | >100Å | n-10¹⁸ | [100] |
|   | Emitter Barrier | AlAs | 25Å | n-10¹⁶ | [100] |
|   | Base | GaAs | 250Å | n-10¹⁸ | [100] |
|   | Collector Barrier | Ga.75Al.25As | 50Å | n-10¹⁶ | [100] |
|   | Collector | GaAs | >100Å | n-10¹⁸ | [100] |
| 3 | Emitter | GaAs | >100Å | n-10¹⁸ | [100] |
|   | Emitter Barrier | Ga.7Al.3As | 25Å | n-10¹⁶ | [100] |
|   | Base | Ge | 100Å | n-10¹⁸ | [100] |
|   | Collector Barrier | GaAs | 50Å | n-10¹⁶ | [100] |
|   | Collector | Ge | >100Å | n-10¹⁸ | [100] |

Referring to the first example of Table 1 and the diagrams of FIGS. 1 and 2, the first two layers 8 and 9 function as the emitter 2 and consist of a semiconductor layer 8 with normal electrons at the (111) level. The ternary materials GaAlAs with significant Al, for example Ga$_{0.5}$Al$_{0.5}$As, that is crystallographically oriented in the [100] direction will satisfy these criteria. The barrier region 9 is thin, about 25 Angstroms wide. A material such as AlAs will satisfy the required conditions and under these conditions electron majority carriers will tunnel through from the normal (1,1,1) states of the Ga$_{0.5}$Al$_{0.5}$As into the (1,1,1) upper valley states of the base region 3. A material that satisfies the requirements to have a (1,1,1) upper valley for the base is GaAs. Tunneling into the (000) minimum in the GaAs will be relatively improbable because of the transverse momentum conservation between the electrons in the layers when all layers are grown in the [100] crystallographic direction.

The width of the base region 3 should be such that carrier transport should be efficient. A width of the order of 250 Angstroms is adequate for this purpose.

The collector region 4 is made up of a barrier region 12 and an external region 13. The barrier region 12 is thin and has at most a small barrier over the upper valley (1,1,1) level. An approximately 50 Angstrom layer of Ga$_{0.75}$Al$_{0.25}$As is satisfactory. This provides a barrier of about 0.3 volts to the flow of electrons from the minimum (0,0,0) in the base 3, while acting as only a very small barrier, approximately 0.04 volts to electrons at the (1,1,1) upper valley level traveling through the GaAs base.

The collector has a layer 13 with a lower normal electron level and may be GaAs.

The base region 3 will be moderately heavily doped to provide a fairly highly conductive base for the chosen base layer thickness of 250 Angstroms so that the base sheet resistance is roughly 500 ohms centimeters. For such a structure as Example 1 of Table 1, the base transit time is approximately $0.3 \times 10^{-12}$ seconds. Thus, it may be seen that the parameters relating to speed are 20 to 50 times faster than the current silicon bipolar technology.

In accordance with the conditions of the invention, the time required for electrons to scatter to the (0,0,0) minimum will be approximately $3 \times 10^{-11}$ seconds and a gain of approximately 100 is realized.

Referring to Example 2 of Table 1, the material Ge is employed in the external emitter region 8.

Referring next to Example 3 of Table 1, this device has advantages because the transport across the base may occur, using as the upper valley the upper (0,0,0) conduction minimum of the material Ge. Because of the small effective mass (approximately 0.04 m) of free electrons in this valley and the absence of polar scattering in Ge, an extremely fast device will be achieved. For this choice of materials, the transport across the base may be ballistic although this is not an essential requirement of this teaching.

Some temperature sensitivity of the device performance is to be expected because of the lower value of energy difference in Ge between the (0,0,0) and the (1,1,1) states. It is necessary that all of the materials be epitaxially compatible with each other and may be deposited in layers using the well established liquid phase epitaxy and molecular beam epitaxy techniques.

Since electrons seem usually to have higher mobility and most devices are constructed using electrons as minority carriers, the discussion and illustrations have been directed to electron flow. However, it would be clear to one skilled in the art that the appropriate substitutions could readily be made in the light of the principles set forth for conversion to the use of holes as minority carriers.

In order to provide a perspective for one skilled in the art in practicing this invention, a comparison is provided in Table 2 of the types of carriers and energy loss mechanisms involved in the upper valley device of this invention and the two prior art devices, the conventional bipolar device and the ballistic or hot electron device. The energy loss mechanism is that mechanism that so changes the energy or state of a minority carrier going through the base that it no longer is able to pass into the collector as part of the collector current.

TABLE 2

|  | Carriers | | Energy loss mechanism |
| --- | --- | --- | --- |
|  | Majority | Minority |  |
| Upper Valley | Normal electrons | Upper valley electrons-excited but not hot | Scattering into normal conduction band states |
| Bipolar (NPN) | Holes | Electrons | Electron-hole recombination |
| Ballistic or hot electron | Normal electrons | Hot electrons in the same minimum | Lattice scattering |

What has been described is a structure for the transport of carriers injected by tunneling wherein materials and crystallographic orientations are assembled so that carriers from a normal energy level in the emitter region tunnel into an upper valley of the same energy level in the base so that they may travel rapidly to the collector with a small probability of loss.

Having thus described our invention, what we claim as new and desire to secure by Letters Patent is:

1. A transistor of the type having emitter, base and collector regions of layers of epitaxial monocrystalline semiconductor material, the improvement for tunneling injection carrier transport comprising:

an energy relationship between said base region and said emitter region whereby an upper valley energy level in said base is essentially equivalent to a normal energy level in said emitter, an emitter barrier having an energy level higher than said normal energy level in said emitter and having a thickness for quantum mechanical tunneling, and a collector barrier higher than the level of normal electrons in said base.

2. A transistor having an emitter, a base and a collector comprising in combination:

a base region of a doped crystallographically oriented semiconductor material having an upper valley energy state of a first value, an emitter region of doped crystallographically oriented semiconductor material epitaxial with said base and having a normal energy state essentially at said first level and further separated from said base by a barrier higher than said first level and of a distance compatible with quantum mechanical tunneling and a collector region of doped crystallographically oriented semiconductor material epitaxial with said base and having a normal energy state that is lower than said first level and having a barrier adjacent to said base.

3. The transistor of claim 2 wherein said base is GaAs, said emitter is $Ga_{0.5}Al_{0.5}As$, said emitter barrier is AlAs, said collector is GaAs and said collector barrier is $Ga_{0.75}Al_{0.25}As$.

4. The transistor of claim 2 wherein said base is GaAs, said emitter is Ge, said emitter barrier is $Ga_{0.5}Al_{0.5}As$, said collector is GaAs and said collector barrier is $Ga_{0.75}Al_{0.25}As$.

5. The transistor of claim 2 wherein said base is Ge, said emitter is GaAs, said emitter barrier is $Ga_{0.7}Al_{0.3}As$, said collector is Ge and said collector barrier is GaAs.

6. A transistor having emitter and collector regions separated by a base region in a crystallographically oriented monocrystalline semiconductor material body, said emitter having a region with a normal energy level of a particular level separated from said base region by an emitter barrier region having a height greater than said particular level and a distance compatible with quantum mechanical tunneling.

said base region having an upper energy valley at said particular level and a thickness distance allowing rapid transport across said base and a low resistance resulting from normal carriers present therein, and said collector having a region with a normal energy level lower than said particular level separated from said base region by a barrier.

7. The transistor of claim 6 wherein said emitter is $Ga_{0.5}Al_{0.5}As$ greater than 100 Å thick, said emitter barrier is AlAs of the order of 25 Å thick, said base is GaAs of the order of 250 Å thick, said collector barrier is $Ga_{0.75}Al_{0.25}As$ of the order of 50 Å thick and said collector is GaAs of the order of greater than 100 Å thick.

8. The transistor of claim 6 wherein said emitter is Ge greater than 100 A thick, said emitter barrier is AlAs of the order of 25 A thick, said base is GaAs of the order of 250 A thick, said collector barrier is $Ga_{0.75}Al_{0.25}As$ of the order of 50 A thick, and said collector is GaAs of the order of greater than 100 A thick.

9. The transistor of claim 6 wherein said emitter is GaAs greater than 100 A thick, said emitter barrier is $Ga_{0.7}Al_{0.3}As$ of the order of 25 A thick, said base is Ge of the order of 100 A thick, said collector barrier is GaAs of the order of 50 A thick, and said collector is Ge of the order of greater than 100 A thick.

* * * * *

UNITED STATES PATENT AND TRADEMARK OFFICE
CERTIFICATE OF CORRECTION

PATENT NO. : 4,396,931

DATED : August 2, 1983

INVENTOR(S) : Dumke et al

It is certified that error appears in the above—identified patent and that said Letters Patent is hereby corrected as shown below:

Col. 6, line 66, delete "of the order of".

Col. 7, line 5, delete "of" third occurrence.

Col. 7, line 6, delete "the order of".

Col. 8, line 6, delete "of the order of".

Signed and Sealed this

Seventh Day of August 1984

[SEAL]

Attest:

Attesting Officer

GERALD J. MOSSINGHOFF

Commissioner of Patents and Trademarks